(12) United States Patent
Omura

(10) Patent No.: US 12,556,161 B2
(45) Date of Patent: Feb. 17, 2026

(54) FILTER ELEMENT AND FILTER DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 120 days.

(21) Appl. No.: 18/584,667

(22) Filed: Feb. 22, 2024

(65) Prior Publication Data

US 2024/0195387 A1 Jun. 13, 2024

Related U.S. Application Data

(63) Continuation of application No. PCT/JP2022/033139, filed on Sep. 2, 2022.

(30) Foreign Application Priority Data

Sep. 6, 2021 (JP) .................. 2021-144912

(51) Int. Cl.
*H03H 9/56* (2006.01)
*H03H 9/17* (2006.01)
(Continued)

(52) U.S. Cl.
CPC ............ *H03H 9/568* (2013.01); *H03H 9/173* (2013.01); *H03H 9/175* (2013.01); *H03H 9/176* (2013.01);
(Continued)

(58) Field of Classification Search
CPC ........ H03H 9/568; H03H 9/173; H03H 9/175; H03H 9/176; H03H 9/25; H03H 9/562;
(Continued)

(56) References Cited

U.S. PATENT DOCUMENTS

2002/0093394 A1 7/2002 Tikka et al.
2008/0055021 A1 3/2008 Ueda et al.
(Continued)

FOREIGN PATENT DOCUMENTS

JP 2007267405 A 10/2007
JP 2008085989 A 4/2008
(Continued)

OTHER PUBLICATIONS

International Search Report in PCT/JP2022/033139, mailed Nov. 29, 2022, 3 pages.
(Continued)

*Primary Examiner* — Jorge L Salazar, Jr.
(74) *Attorney, Agent, or Firm* — Keating & Bennett, LLP

(57) ABSTRACT

A filter element includes a piezoelectric layer with a polarization axis direction, and division resonators provided at the piezoelectric layer. Each of the division resonators includes a functional electrode on the piezoelectric layer. Each of the functional electrodes includes high and low potential electrodes. When a direction parallel or substantially parallel to a direction in which the high and low potential electrodes face each other and oriented from the high-potential electrode toward the low-potential electrode is an inter-electrode direction, and a number of division resonators having the forward direction relationship is equal to a number of division resonators having the opposite direction relationship.

20 Claims, 6 Drawing Sheets

(51) Int. Cl.
  *H03H 9/25* (2006.01)
  *H03H 9/64* (2006.01)

(52) U.S. Cl.
  CPC .............. *H03H 9/25* (2013.01); *H03H 9/562* (2013.01); *H03H 9/564* (2013.01); *H03H 9/6483* (2013.01)

(58) Field of Classification Search
  CPC ........ H03H 9/564; H03H 9/6483; H03H 9/17; H03H 9/54; H03H 9/64
  USPC .................................. 333/186–188, 193–196
  See application file for complete search history.

(56) References Cited

U.S. PATENT DOCUMENTS

| | | | |
|---|---|---|---|
| 2012/0194034 A1* | 8/2012 | Miyake | H03H 9/132 310/320 |
| 2016/0118956 A1 | 4/2016 | Kihara et al. | |
| 2017/0019085 A1 | 1/2017 | Kida et al. | |
| 2017/0163242 A1 | 6/2017 | Miyamoto et al. | |

FOREIGN PATENT DOCUMENTS

| | | |
|---|---|---|
| JP | 2010021914 A | 1/2010 |
| JP | 2017022667 A | 1/2017 |
| JP | 2017103654 A | 6/2017 |
| JP | 2018101964 A | 6/2018 |
| JP | 2019193220 A | 10/2019 |
| JP | 2020014096 A | 1/2020 |
| WO | 2015002047 A1 | 1/2015 |

OTHER PUBLICATIONS

Written Opinion in PCT/JP2022/033139, mailed Nov. 29, 2022, 5 pages.

* cited by examiner

FILTER ELEMENT AND FILTER DEVICE

CROSS REFERENCE TO RELATED APPLICATIONS

This application claims the benefit of priority to Japanese Patent Application No. 2021-144912 filed on Sep. 6, 2021 and is a Continuation Application of PCT Application No. PCT/JP2022/033139 filed on Sep. 2, 2022. The entire contents of each application are hereby incorporated herein by reference.

BACKGROUND OF THE INVENTION

1. Field of the Invention

The present invention relates to filter elements including acoustic wave resonators and filter devices including filter elements.

2. Description of the Related Art

In the related art, a filter element using an acoustic wave resonator is widely used in cellular phones and the like. Japanese Unexamined Patent Application Publication No. 2007-267405 discloses a filter structure as an example of the filter element. The filter structure includes a Bulk Acoustic Wave (BAW) resonator. The BAW resonator is divided in series to increase its electric power handling capability and improve its IMD (Intermodulation Distortion) characteristics. A resonator group obtained by dividing the BAW resonator in series is used in a ladder filter.

In recent years, there has been a demand for further improving the electric power handling capability and the IMD characteristics. However, it is difficult to sufficiently improve the electric power handling capability and the IMD characteristics in the filter structure described in Japanese Unexamined Patent Application Publication No. 2007-267405.

SUMMARY OF THE INVENTION

Example embodiments of the present invention provide filter elements and filter devices that are each able to effectively improve the electric power handling capability and the IMD characteristics.

A filter element according to an example embodiment of the present invention includes a piezoelectric layer with a polarization axis direction, and a plurality of division resonators including at least four division resonators provided at the piezoelectric layer by dividing one acoustic wave resonator in series and in parallel. Each of the plurality of division resonators includes a functional electrode on the piezoelectric layer. Each of the functional electrodes includes a high-potential electrode with a relatively high potential and a low-potential electrode with a relatively low potential. When a direction parallel or substantially parallel to a direction in which the high-potential electrode and the low-potential electrode face each other and oriented from the high-potential electrode toward the low-potential electrode is defined as an inter-electrode direction, and when a relationship in which a component of the polarization axis direction parallel or substantially parallel to the inter-electrode direction and the inter-electrode direction are in the same or substantially the same direction is defined as a forward direction relationship and a relationship in which the component of the polarization axis direction parallel or substantially parallel to the inter-electrode direction and the inter-electrode direction are in the opposite directions is defined as an opposite direction relationship, the number of division resonators having the forward direction relationship is equal to the number of division resonators having the opposite direction relationship among the plurality of division resonators.

A filter device according to an example embodiment of the present invention is a ladder filter including a plurality of resonators in a series arm and a parallel arm, wherein a filter element according to an example embodiment of the present invention is provided in the series arm.

A filter device according to an example embodiment of the present invention is a ladder filter including a plurality of resonators in a series arm and a parallel arm, wherein a filter element according to an example embodiment of the present invention is provided in the parallel arm.

With the filter elements and the filter devices according to example embodiments of the present invention, the electric power handling capability and the IMD characteristics are effectively improved.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be clarified below by describing example embodiments of the present invention with reference to the drawings.

Each example embodiment described herein is exemplary, and partial substitution or combination of configurations between different example embodiments is possible.

Figure 1:
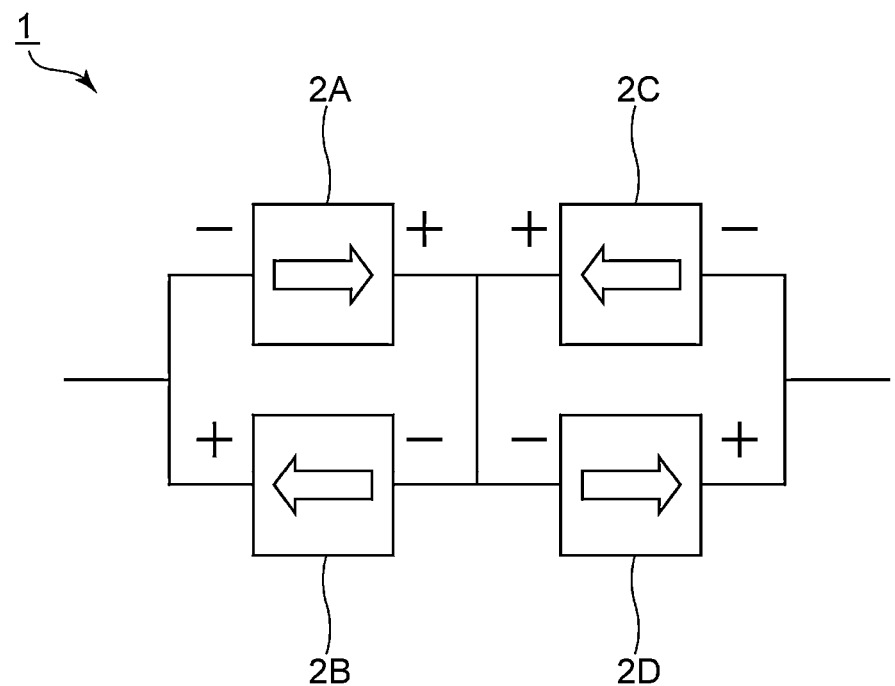
FIG. 1 is a schematic view of a filter element according to a first example embodiment of the present invention.

FIG. 1 is a schematic view of a filter element according to a first example embodiment of the present invention.

A filter element 1 provided in a filter device such as, for example, a ladder filter. The filter element 1 includes a first division resonator 2A, a second division resonator 2B, a third division resonator 2C, and a fourth division resonator 2D. The arrows attached to respective division resonators in FIG. 1 schematically indicate a polarization axis direction of the piezoelectric layer, which will be discussed later. Furthermore, the positive and negative signs in FIG. 1 are based on the positive and negative in the polarization axis direction. More specifically, of the two end portions of each division resonator, the negative sign is attached to the end portion located on the negative side in the polarization axis direction. Of the two end portions of each division resonator, the positive sign is attached to the end portion located on the positive side in the polarization axis direction. The same is true for schematic views other than FIG. 1.

Figure 2:
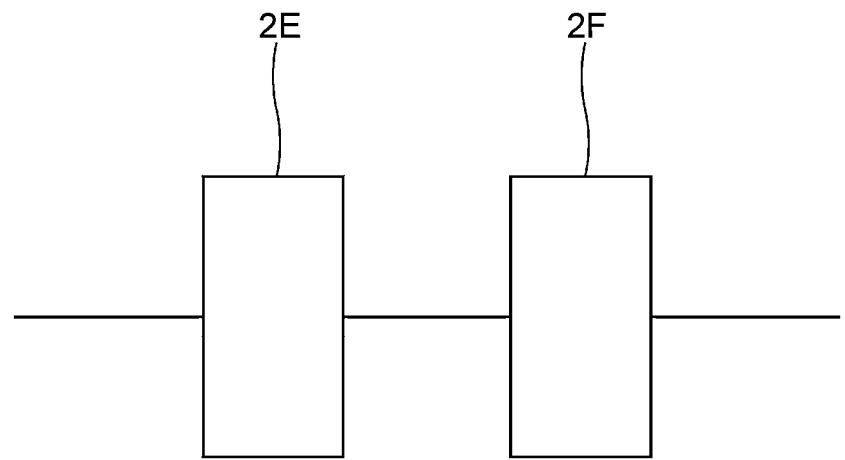
FIG. 2 is a schematic view illustrating a mode of division of an acoustic wave resonator in the first example embodiment of the present invention.

Respective division resonators are formed by dividing one acoustic wave resonator in series and in parallel. More specifically, as illustrated in FIG. 2, one acoustic wave resonator is divided in series. This provides a division resonator 2E and a division resonator 2F. In the filter element 1, the division resonator 2E is divided in parallel. This provides the first division resonator 2A and the second division resonator 2B illustrated in FIG. 1. The division resonator 2F is also divided in parallel. This provides the third division resonator 2C and the fourth division resonator 2D. Thus, four division resonators are provided in the present example embodiment. However, the number of the division resonators in the filter element 1 is not limited to four.

The difference between the resonant frequencies or between the anti-resonant frequencies among the plurality of division resonators obtained by performing division in series and in parallel is set to, for example, within about 1%. Between the division resonators, the resonant frequencies do not have to be the same or substantially the same as each other, and the anti-resonant frequencies do not have to be the same or substantially the same as each other. The difference between the resonant frequencies of two division resonators can be obtained as $|fr1-fr2|/fr1$ when the resonant frequency of one of the two division resonators is represented as $fr1$ and the resonant frequency of the other is represented as $fr2$. Similarly, the difference between the anti-resonant frequencies of two division resonators can be obtained as $|fa1-fa2|/fa1$ when the anti-resonant frequency of one of the two division resonators is represented as $fa1$ and the anti-resonant frequency of the other is represented as $fa2$.

The first division resonator 2A and the second division resonator 2B are connected in common to the same potential. The third division resonator 2C and the fourth division resonator 2D are connected in common to both the first division resonator 2A and the second division resonator 2B. The specific configuration of each division resonator is described below.

Figure 3:
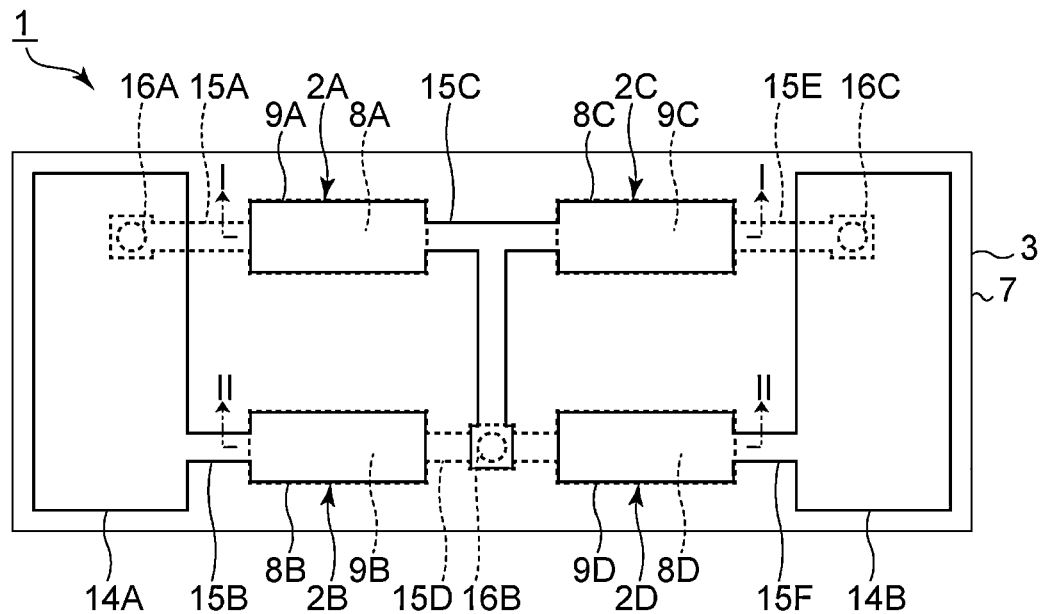
FIG. 3 is a schematic plan view of the filter element according to the first example embodiment of the present invention.
Figure 4:
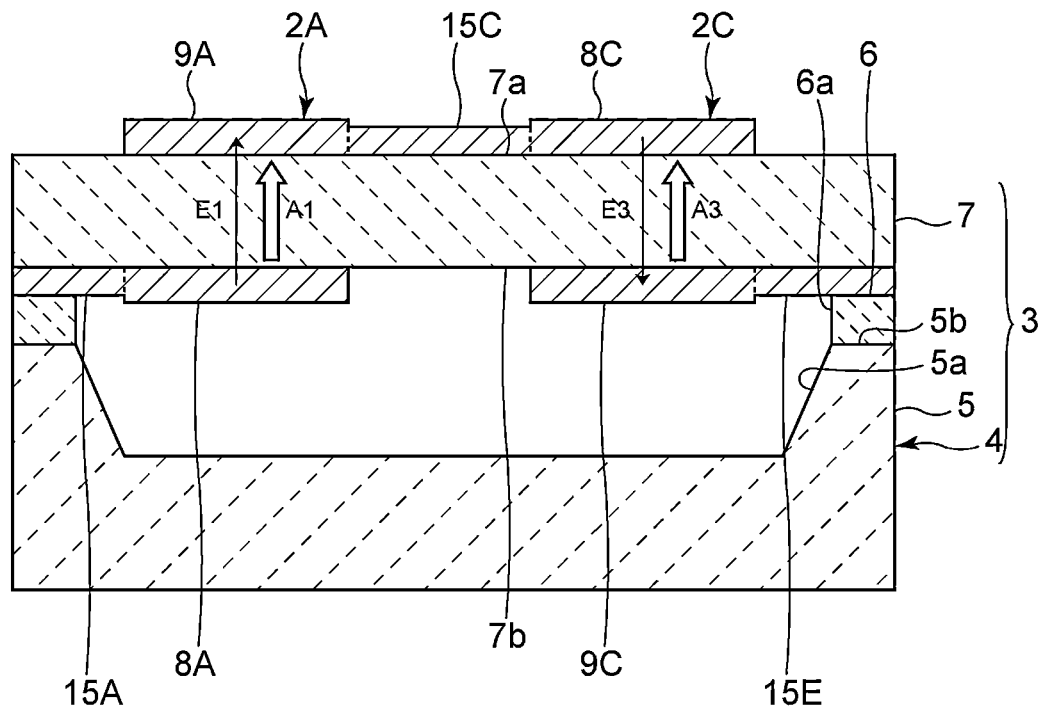
FIG. 4 is a schematic sectional view taken along line I-I of FIG. 3.
Figure 5:
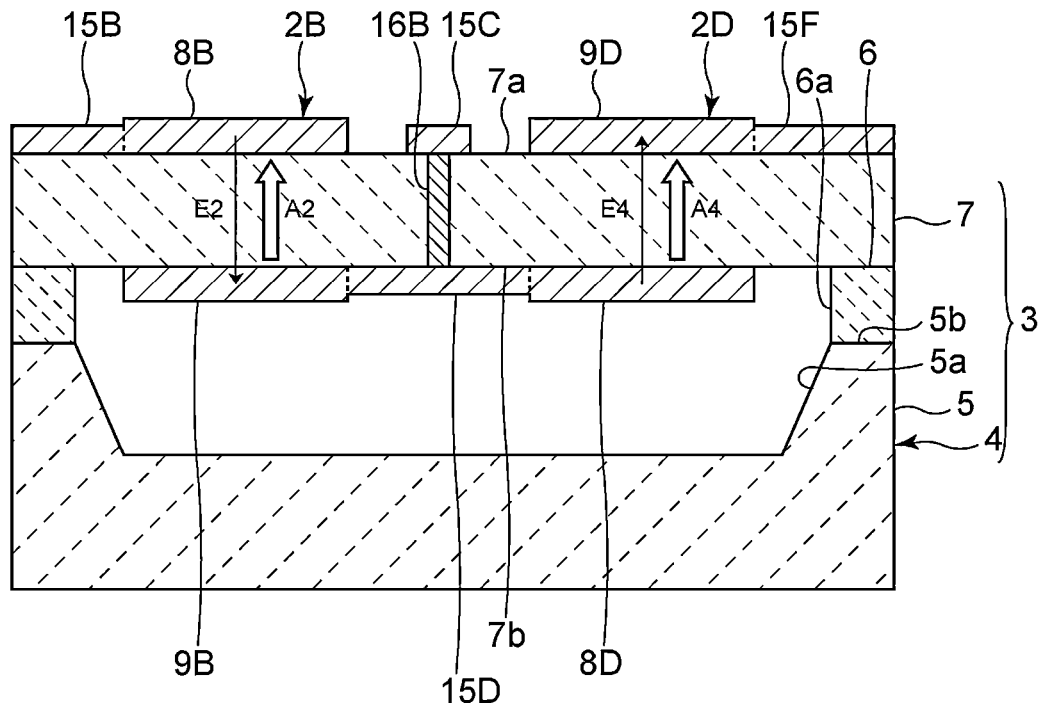
FIG. 5 is a schematic sectional view taken along line II-II of FIG. 3.

FIG. 3 is a schematic plan view of the filter element according to the first example embodiment. FIG. 4 is a schematic sectional view taken along line I-I of FIG. 3. FIG. 5 is a schematic sectional view taken along line II-II of FIG. 3. The dashed lines in FIGS. 4 and 5 indicate boundaries between the electrodes.

As illustrated in FIG. 3, the filter element 1 includes a piezoelectric substrate 3. The first division resonator 2A, the second division resonator 2B, the third division resonator 2C, and the fourth division resonator 2D share the piezoelectric substrate 3. The piezoelectric substrate 3 includes a piezoelectric layer 7. A plurality of functional electrodes are provided on the piezoelectric layer 7. Thus, each division resonator is provided at the piezoelectric layer 7. In the present example embodiment, each division resonator is, for example, a BAW element.

As illustrated in FIG. 4, the piezoelectric substrate 3 includes a support 4 and the piezoelectric layer 7. The piezoelectric layer 7 is provided on the support 4. The piezoelectric layer 7 includes a first main surface 7a and a second main surface 7b. The first main surface 7a and the second main surface 7b face each other. Of the first main surface 7a and the second main surface 7b, the second main surface 7b is a main surface on the support 4 side. The piezoelectric layer 7 is, for example, a lithium tantalate layer or a lithium niobate layer.

The functional electrodes of the first division resonator 2A are a high-potential electrode 8A and a low-potential electrode 9A. The high-potential electrode 8A has a relatively high potential. The low-potential electrode 9A has a relatively low potential. In other words, the high-potential electrode 8A is connected to a side with a higher potential than the low-potential electrode 9A. The high-potential electrode 8A is provided on the second main surface 7b of the piezoelectric layer 7. The low-potential electrode 9A is provided on the first main surface 7a. The high-potential electrode 8A and the low-potential electrode 9A face each other with the piezoelectric layer 7 interposed therebetween.

Here, a direction parallel or substantially parallel to the direction in which the high-potential electrode 8A and the low-potential electrode 9A face each other and oriented from the high-potential electrode 8A toward the low-potential electrode 9A is defined as an inter-electrode direction E1. The inter-electrode direction E1 in the first division resonator 2A is the same or substantially the same as the direction oriented from the second main surface 7b of the piezoelectric layer 7 toward the first main surface 7a. On the other hand, the piezoelectric layer 7 has a polarization axis direction A, which is not shown in the drawings. In the present example embodiment, the polarization axis direction A is inclined with respect to the thickness direction of the piezoelectric layer 7. The component of the polarization axis direction A parallel or substantially parallel to the inter-electrode direction E1 is a component A1 illustrated in FIG. 4. The component A1 of the polarization axis direction A and the inter-electrode direction E1 are in the same or substantially the same direction. When a relationship in which the component A1 of the polarization axis direction A parallel or substantially parallel to the inter-electrode direction E1 and the inter-electrode direction E1 are the same or substantially the same direction is defined as a forward direction relationship, and a relationship in which the component A1 of the polarization axis direction A parallel or substantially parallel to the inter-electrode direction E1 and the inter-electrode direction E1 are the opposite directions is defined as an opposite direction relationship, the first division resonator 2A has the forward direction relationship.

The second division resonator 2B, the third division resonator 2C, and the fourth division resonator 2D also each include a high-potential electrode and a low-potential electrode. As in the first division resonator 2A, in each division resonator, the high-potential electrode and the low-potential electrode face each other with the piezoelectric layer 7 interposed therebetween. The inter-electrode direction in each division resonator of the filter element 1 is parallel or substantially parallel to the thickness direction of the piezoelectric layer 7. Furthermore, the polarization axis direction A of the piezoelectric layer 7 in the filter element 1 is the same or substantially the same in the portion where the respective division resonators are configured. Thus, the direction of each component of the polarization axis direction A parallel or substantially parallel to the inter-electrode direction in each division resonator is the same or substantially the same.

As illustrated in FIG. 5, a high-potential electrode 8B of the second division resonator 2B is provided on the first main surface 7a of the piezoelectric layer 7. A low-potential electrode 9B is provided on the second main surface 7b. Thus, an inter-electrode direction E2 of the second division resonator 2B is opposite to the inter-electrode direction E1 of the first division resonator 2A. A component A2 of the polarization axis direction A parallel or substantially parallel to the inter-electrode direction E2 and the inter-electrode direction E2 are opposite to each other. Thus, the second division resonator 2B, unlike the first division resonator 2A, has the opposite direction relationship.

As illustrated in FIG. 4, in the third division resonator 2C, a component A3 of the polarization axis direction A parallel or substantially parallel to an inter-electrode direction E3 and the inter-electrode direction E3 are opposite to each other. Thus, the third division resonator 2C has the opposite direction relationship. As illustrated in FIG. 5, in the fourth division resonator 2D, a component A4 of the polarization axis direction A parallel or substantially parallel to an inter-electrode direction E4 and the inter-electrode direction E4 are in the same or substantially the same direction. Thus, the fourth division resonator 2D has the forward direction relationship. Among the four division resonators of the filter element 1, two division resonators have the forward direction relationship and the other two division resonators have the opposite direction relationship.

In the present example embodiment, at least four division resonators formed by dividing one acoustic wave resonator in series and parallel are provided, and among the plurality of division resonators, the number of the division resonators having the forward direction relationship is equal to the number of the division resonators having the opposite direction relationship. Since the plurality of division resonators are division resonators formed by performing division in series and in parallel, the power applied to each division resonator can be effectively lowered. Thus, the electric power handling capability can be effectively improved. Furthermore, the number of division resonators having the forward direction relationship is equal to the number of division resonators having the opposite direction relationship, which enables the IMD components to be canceled out for the plurality of division resonators as a whole. Thus, the IMD characteristics can be effectively improved.

As described above, the difference in resonant frequency or anti-resonant frequency between the division resonators is, for example, within about 1%. Thus, the electric power handling capability can be improved and the IMD characteristics can be effectively improved without increasing the ripple in the pass band.

It is preferable that the resonant frequencies between at least two of the plurality of division resonators are not the same. Thus, the level of unwanted waves can be reduced for the plurality of division resonators as a whole.

The configuration of the present example embodiment is described in more detail below.

Each division resonator includes an excitation region. An acoustic wave is excited in the excitation region. As described above, each division resonator of the filter element 1 is, for example, a BAW element. In such a case, the excitation region of each division resonator is a region where the high-potential electrode and the low-potential electrode of each division resonator face each other. More specifically, the excitation region of each division resonator is a region where the high-potential electrode and the low-potential electrode of each division resonator overlap in plan view. In this specification, the term "plan view" refers to the view from above in FIG. 4 or FIG. 5.

As illustrated in FIG. 3, the filter element 1 includes a first common connecting electrode 14A, a second common connecting electrode 14B, a first connecting electrode 15A, a second connecting electrode 15B, a third connecting electrode 15C, a fourth connecting electrode 15D, a fifth connecting electrode 15E and a sixth connecting electrode 15F. The filter element 1 further includes a through electrode 16A, a through electrode 16B, and a through electrode 16C. The through electrode 16A, the through electrode 16B, and the through electrode 16C pass through the piezoelectric layer 7 in the thickness direction.

The first common connecting electrode 14A and the second common connecting electrode 14B are provided on the first main surface 7a of the piezoelectric layer 7. The high-potential electrode 8A of the first division resonator 2A and the high-potential electrode 8B of the second division resonator 2B are connected in common to the first common connecting electrode 14A. The high-potential electrode 8A of the first division resonator 2A is connected to the first common connecting electrode 14A with the first connecting electrode 15A and the through electrode 16A interposed therebetween. Specifically, the first connecting electrode 15A and the high-potential electrode 8A of the first division resonator 2A are provided on the second main surface 7b of the piezoelectric layer 7. The high-potential electrode 8A is connected to the first connecting electrode 15A. One end of the through electrode 16A is connected to the first connecting electrode 15A. Furthermore, the other end of the through electrode 16A is connected to the first common connecting electrode 14A.

On the other hand, the high-potential electrode 8B of the second division resonator 2B is connected to the first common connecting electrode 14A with the second connecting electrode 15B interposed therebetween. Specifically, the second connecting electrode 15B and the high-potential electrode 8B of the second division resonator 2B are provided on the first main surface 7a of the piezoelectric layer 7.

A high-potential electrode 8C of the third division resonator 2C and a high-potential electrode 8D of the fourth division resonator 2D are connected in common to the low-potential electrode 9A of the first division resonator 2A. The high-potential electrode 8C of the third division resonator 2C is connected to the low-potential electrode 9A of the first division resonator 2A with the third connecting electrode 15C interposed therebetween. Specifically, the third connecting electrode 15C and the high-potential electrode 8C of the third division resonator 2C are provided on the first main surface 7a of the piezoelectric layer 7. The third connecting electrode 15C is branched. The third connecting electrode 15C is connected to the low-potential electrode 9A of the first division resonator 2A and to the high-potential electrode 8C of the third division resonator 2C, as well as to the through electrode 16B.

The high-potential electrode 8D of the fourth division resonator 2D is connected to the low-potential electrode 9A of the first division resonator 2A with the fourth connecting electrode 15D, the through electrode 16B and the third connecting electrode 15C interposed therebetween. Specifically, the fourth connecting electrode 15D and the high-potential electrode 8D of the fourth division resonator 2D are provided on the second main surface 7b of the piezoelectric layer 7. The high-potential electrode 8D is connected to the fourth connecting electrode 15D. One end of the through electrode 16B is connected to the fourth connecting electrode 15D. Furthermore, the other end of the through electrode 16B is connected to the third connecting electrode 15C. The third connecting electrode 15C is connected to the low-potential electrode 9A of the first division resonator 2A.

Furthermore, the high-potential electrode 8C of the third division resonator 2C and the high-potential electrode 8D of the fourth division resonator 2D are connected in common to the low-potential electrode 9B of the second division resonator 2B. The high-potential electrode 8C of the third division resonator 2C is connected to the low-potential electrode 9B of the second division resonator 2B with the third connecting electrode 15C, the through electrode 16B and the fourth connecting electrode 15D interposed therebetween. The high-potential electrode 8D of the fourth division resonator 2D is connected to the low-potential electrode 9B of the second division resonator 2B with the fourth connecting electrode 15D interposed therebetween.

A low-potential electrode 9C of the third division resonator 2C and a low-potential electrode 9D of the fourth division resonator 2D are connected in common to the second common connecting electrode 14B. The low-potential electrode 9C of the third division resonator 2C is connected to the second common connecting electrode 14B with the fifth connecting electrode 15E and the through electrode 16C interposed therebetween. Specifically, the fifth connecting electrode 15E and the low-potential electrode 9C of the third division resonator 2C are provided on the second main surface 7b of the piezoelectric layer 7. The low-potential electrode 9C is connected to the fifth connecting electrode 15E. One end of the through electrode 16C is connected to the fifth connecting electrode 15E. Furthermore, the other end of the through electrode 16C is connected to the second common connecting electrode 14B.

On the other hand, the low-potential electrode 9D of the fourth division resonator 2D is connected to the second common connecting electrode 14B with the sixth connecting electrode 15F interposed therebetween. Specifically, the sixth connecting electrode 15F and the low-potential electrode 9D of the fourth division resonator 2D are provided on the first main surface 7a of the piezoelectric layer 7.

In the filter element 1, the first division resonator 2A and the second division resonator 2B of the plurality of division resonators are connected in common to the highest potential. When the plurality of division resonators are each classified into different stages of division resonators based on the order of connecting the division resonators from the high potential side, the first division resonator 2A and the second division resonator 2B are first stage division resonators. The third division resonator 2C is connected to the first division resonator 2A, which is the first stage division resonator. Thus, the third division resonator 2C is a second stage division resonator. Similarly, the fourth division resonator 2D is also the second stage division resonator. In the present example embodiment, the plurality of division resonators include two stages of division resonators. However, the plurality of division resonators may also include three or more stages of division resonators.

It is preferable that among the plurality of division resonators, the number of division resonators in the same stage is two, and one of the two division resonators in the same stage has the forward direction relationship and the other has the opposite direction relationship. More specifically, it is preferable that the first division resonator 2A, which is one of the two division resonators in the first stage, has the forward direction relationship and the second division resonator 2B, which is the other of the two division resonators in the first stage, has the opposite direction relationship, as in the present example embodiment. Alternatively, it is preferable that the first division resonator 2A has the opposite direction relationship and the second division resonator 2B has the forward direction relationship. Thus, the IMD component can be canceled out more reliably and effectively. Similarly, it is preferable that the third division resonator 2C, which is one of the two division resonators in the second stage, has the opposite direction relationship and the fourth division resonator 2D, which is the other of the two division resonators in the second stage, has the forward direction relationship. Alternatively, it is preferable that the third division resonator 2C has the forward direction relationship and the fourth division resonator 2D has the opposite direction relationship. Thus, the IMD component can be canceled out more reliably and effectively.

It is preferable that the excitation regions of the two division resonators in the same stage have the same or substantially the same area. Thus, the impedances of the two division resonators in the same stage can be made the same or substantially the same. Therefore, the IMD characteristics can be further improved. More specifically, it is preferable that the areas of the excitation regions of the first division resonator 2A and the second division resonator 2B, which are both the first stage division resonators, are the same pr substantially the same. Similarly, it is preferable that the areas of the excitation regions of the third division resonator 2C and the fourth division resonator 2D, which are both the second stage division resonators, are the same or substantially the same. It is more preferable that the areas of the excitation regions of all division resonators are the same or substantially the same. Thus, the IMD component can be further canceled out more effectively and reliably.

As illustrated in FIG. 1, it is preferable that the third division resonator 2C and the fourth division resonator 2D are connected in common to both the first division resonator 2A and the second division resonator 2B. Thus, the overall characteristic degradation caused by the characteristic differences between respective resonators due to manufacturing variation can be reduced while maintaining the potential at the common point constant.

In the present example embodiment, respective division resonators share one piezoelectric layer 7. The polarization axis direction A of the piezoelectric layer 7 is uniform. However, for example, in the piezoelectric layer 7, the portion corresponding to the first division resonator 2A and the portion corresponding to the second division resonator 2B may be polarized in opposite directions to each other. In the piezoelectric layer 7, the portion corresponding to the third division resonator 2C and the portion corresponding to the fourth division resonator 2D may be polarized in opposite directions to each other. Alternatively, a plurality of piezoelectric layers 7 may be provided, and each division resonator includes a separate piezoelectric layer 7.

The piezoelectric substrate 3 is described in detail below.

As illustrated in FIG. 4, the piezoelectric substrate 3 includes the support 4 and the piezoelectric layer 7. In the present example embodiment, the support 4 includes a support substrate 5 and a joining layer 6. The joining layer 6 is provided on the support substrate 5. The piezoelectric layer 7 is provided on the joining layer 6.

More specifically, the support substrate 5 includes a recess 5a and a support portion 5b. The support portion 5b surrounds the recess 5a. The joining layer 6 is provided on the support portion 5b. The joining layer 6 has a frame shape. More specifically, the joining layer 6 includes a through hole 6a. The recess 5a of the support substrate 5 and the through hole 6a of the joining layer 6 define a recess of the support 4. The piezoelectric layer 7 is provided to close the recess of the support 4. Thus, a cavity is provided. The cavity is surrounded by the recess of the support 4 and the piezoelectric layer 7. The configuration of the cavity is not limited to the above. For example, the cavity may include a through hole continuously provided in the support substrate 5 and the joining layer 6. Alternatively, the cavity may be provided only by the through hole 6a of the joining layer 6. In such a case, the support substrate 5 does not need to include a recess or a through hole. On the other hand, the cavity may also be provided only by a recess or a through hole of the support substrate 5.

Examples of the material that can be used as the material of the support substrate 5 include a piezoelectric material such as aluminum nitride, lithium tantalate, lithium niobate, quartz or the like, a ceramic such as alumina, sapphire, magnesia, silicon nitride, silicon carbide, zirconia, cordierite, mullite, steatite, forsterite, spinel, sialon or the like, a dielectric such as aluminum oxide, silicon oxynitride, DLC (diamond-like carbon), diamond or the like, a semiconductor such as silicon or the like, or a material mainly including the above materials. Examples of the spinel include an aluminum compound including one or more elements selected from Mg, Fe, Zn, Mn and the like and oxygen. Examples of the spinel include $MgAl_2O_4$, $FeAl_2O_4$, $ZnAl_2O_4$, and $MnAl_2O_4$.

Examples of the material that can be used as the material of the joining layer 6 include silicon oxide, silicon nitride, tantalum oxide, and the like. The joining layer 6 does not have to be provided. The support 4 may be provided only by the support substrate 5.

A suitable piezoelectric single crystal can be used as the material of the piezoelectric layer 7. However, it is preferable that the piezoelectric layer 7 is, for example, a lithium tantalate layer or a lithium niobate layer. In such a case, the dielectric constant of the piezoelectric layer 7 can be preferably increased. Thus, the area of the plurality of division resonators is not likely to become large.

Figure 6:
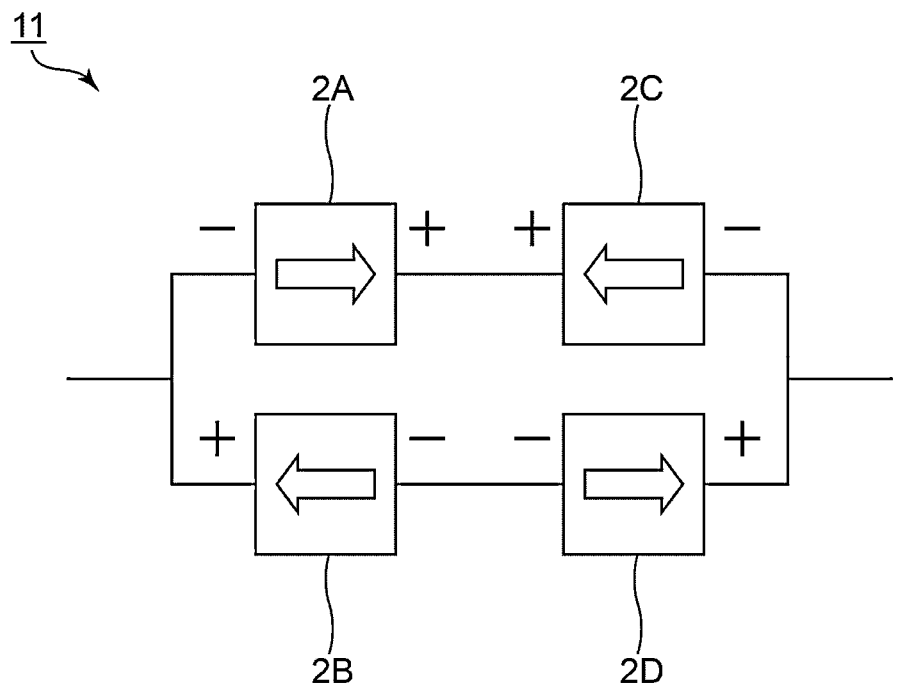
FIG. 6 is a schematic view of a filter element according to a second example embodiment of the present invention.

FIG. 6 is a schematic view of a filter element according to a second example embodiment of the present invention.

The present example embodiment differs from the first example embodiment in that a first division resonator 2A and a fourth division resonator 2D are not connected, and a second division resonator 2B and a third division resonator 2C are not connected. The first division resonator 2A and the third division resonator 2C are connected in series with each other. The second division resonator 2B and the fourth division resonator 2D are connected in series with each other. Except for the above-described differences, a filter element 11 of the second example embodiment has the same or substantially the same configuration as the filter element 1 of the first example embodiment.

In the filter element 11, an original single acoustic wave resonator is divided in parallel. One of the division resonators defined by dividing the original single acoustic wave resonator in parallel is divided in series. Thus, the first division resonator 2A and the third division resonator 2C are provided. The other of the division resonators defined by dividing the original single acoustic wave resonator in parallel is also divided in series. Thus, the second division resonator 2B and the fourth division resonator 2D are provided.

The first division resonator 2A and the second division resonator 2B are first stage division resonators. The third division resonator 2C is connected to the first division resonator 2A, which is the first stage division resonator. Therefore, the third division resonator 2C is a second stage division resonator. On the other hand, the fourth division resonator 2D is connected to the second division resonator 2B, which is the first stage division resonator. Therefore, the fourth division resonator 2D is also a second stage division resonator.

In the present example embodiment, as in the first example embodiment, among the four division resonators, the first division resonator 2A and the fourth division resonator 2D have the forward direction relationship, and the second division resonator 2B and the third division resonator 2C have the opposite direction relationship. Thus, the electric power handling capability and the IMD characteristics can be effectively improved.

Figure 7:
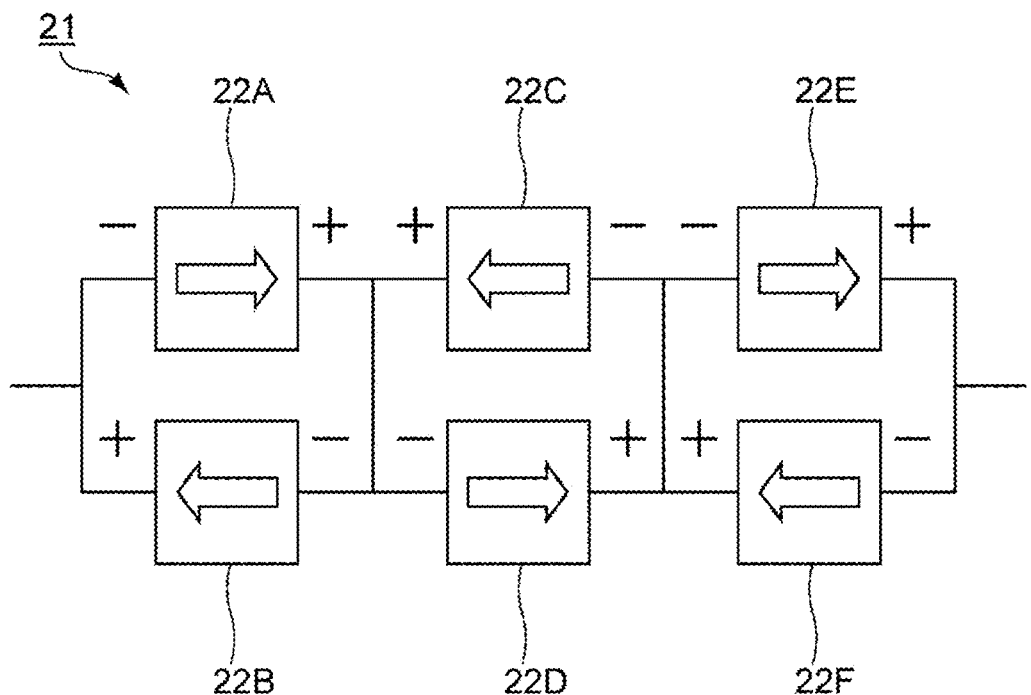
FIG. 7 is a schematic view of a filter element according to a third example embodiment of the present invention.

FIG. 7 is a schematic view of a filter element according to a third example embodiment of the present invention.

The present example embodiment differs from the first example embodiment in that six division resonators are provided by dividing one acoustic wave resonator in series and in parallel. Except for the above-described difference, a filter element 21 of the third example embodiment has the same or substantially the same configuration as the filter element 1 of the first example embodiment.

The plurality of division resonators are a first division resonator 22A, a second division resonator 22B, a third division resonator 22C, a fourth division resonator 22D, a fifth division resonator 22E, and a sixth division resonator 22F. In the filter element 21, an original single acoustic wave resonator is divided into three division resonators in series. One of the three division resonators defined by dividing the original single acoustic wave resonator in series is divided in parallel. Thus, the first division resonator 22A and the second division resonator 22B are provided. Another one of the three division resonators is also divided in parallel. Thus, the third division resonator 22C and the fourth division resonator 22D are provided. The remaining one of the three division resonators is also divided in parallel. Thus, the fifth division resonator 22E and the sixth division resonator 22F are provided.

Among the plurality of division resonators, the first division resonator 22A and the second division resonator 22B, which are located on the leftmost side in FIG. 7, are division resonators on the highest potential side. The fifth division resonator 22E and the sixth division resonator 22F, which are located on the rightmost side in FIG. 7, are division resonators on the lowest potential side. Thus, the direction from left to right in FIG. 7 corresponds to the inter-electrode direction in each division resonator. Here, each arrow in FIG. 7 schematically illustrates a component of the polarization axis direction parallel or substantially parallel to the inter-electrode direction. When the direction of the above arrow and the inter-electrode direction in the division resonator are the same, it means that the division resonator has the forward direction relationship. Specifically, when the above arrow is rightward, the division resonator has the forward direction relationship. On the other hand, when the direction of the above arrow and the inter-electrode direction in the division resonator are opposite to each other, it means that the division resonator has the opposite direction relationship. Specifically, if the above arrow is leftward, the division resonator has the opposite direction relationship.

In the present example embodiment, the first division resonator 22A, the fourth division resonator 22D, and the fifth division resonator 22E each have the forward direction relationship. On the other hand, the second division resonator 22B, the third division resonator 22C, and the sixth division resonator 22F each have the opposite direction relationship. Thus, in the filter element 21, as in the first example embodiment, among the plurality of division resonators, the number of division resonators having the forward direction relationship is equal to the number of division resonators having the opposite direction relationship. Thus, the electric power handling capability and the IMD characteristics can be effectively improved.

The plurality of division resonators of the filter element 21 include three stages of division resonators. The first division resonator 22A and the second division resonator 22B are first stage division resonators. The third division resonator 22C and the fourth division resonator 22D are second stage division resonators. The fifth division resonator 22E and the sixth division resonator 22F are third stage division resonators.

The fifth division resonator 22E may be connected to at least the third division resonator 22C. In such a case, the fifth division resonator 22E is the third stage division resonator. Similarly, the sixth division resonator 22F may be connected to at least the fourth division resonator 22D. In such a case, the sixth division resonator 22F is the third stage division resonator. For example, the fifth division resonator 22E may be connected in series with the third division resonator 22C and the sixth division resonator 22F may be connected in series with the fourth division resonator 22D.

Figure 8:
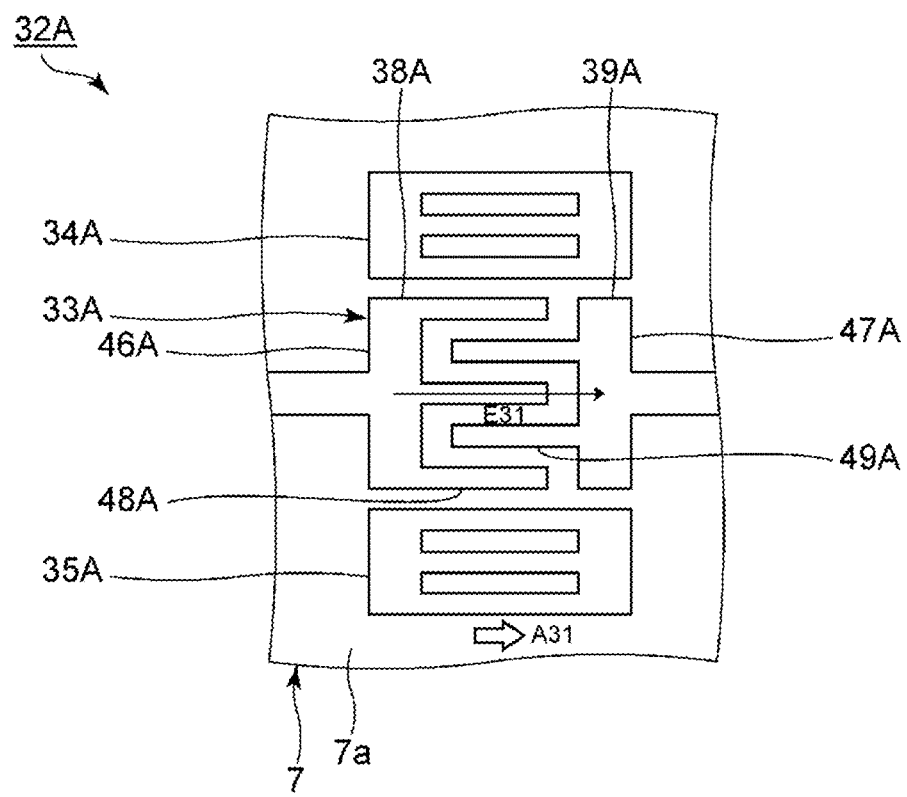
FIG. 8 is a schematic plan view of a first division resonator in a fourth example embodiment of the present invention.

FIG. 8 is a schematic plan view of a first division resonator in a fourth example embodiment of the present invention.

The present example embodiment differs from the first example embodiment in that each division resonator is a SAW (Surface Acoustic Wave) device. Except for the above-described difference, the filter element of the present example embodiment has the same or substantially the same configuration as the filter element 1 of the first example embodiment. Four division resonators are also provided in the present example embodiment.

As illustrated in FIG. 8, a first division resonator 32A includes an IDT electrode 33A. The functional electrode of the first division resonator 32A is the IDT electrode 33A. The IDT electrode 33A is provided on a first main surface 7a of a piezoelectric layer 7. A surface acoustic wave is excited by applying an AC voltage to the IDT electrode 33A. A pair of reflectors 34A and 35A are provided on both sides of the IDT electrode 33A in the acoustic wave propagation direction on the first main surface 7a.

The IDT electrode 33A includes a high-potential electrode 38A and a low-potential electrode 39A. The high-potential electrode 38A includes a first busbar 46A and a plurality of first electrode fingers 48A. One end of each of the plurality of first electrode fingers 48A is connected to the first busbar 46A. On the other hand, the low-potential electrode 39A includes a second busbar 47A and a plurality of second electrode fingers 49A. One end of each of the plurality of second electrode fingers 49A is connected to the second busbar 47A. The first busbar 46A and the second busbar 47A face each other. The plurality of first electrode fingers 48A and the plurality of second electrode fingers 49A are inter-digitated with each other.

In the present example embodiment, an inter-electrode direction E31 is a direction that is parallel or substantially parallel to the direction in which the first busbar 46A and the second busbar 47A face each other and that is oriented from the first busbar 46A toward the second busbar 47A. The inter-electrode direction E31 is parallel or substantially parallel to the first main surface 7a of the piezoelectric layer 7. On the other hand, the polarization axis direction A of the piezoelectric layer 7 is inclined with respect to the thickness direction of the piezoelectric layer 7, as in the first example embodiment. The component of the polarization axis direction A parallel or substantially parallel to the inter-electrode direction E31 is a component A31 illustrated in FIG. 8. The first division resonator 32A has the forward direction relationship.

Similar to the first division resonator 32A, second to fourth division resonators each include an IDT electrode and a pair of reflectors. The IDT electrodes and the reflectors of all division resonators are provided on the first main surface 7a of the piezoelectric layer 7. However, the IDT electrode of at least one of the plurality of division resonators may be provided on the first main surface 7a, and the IDT electrode of at least one of the division resonators may be provided on the second main surface 7b.

In each division resonator, the direction in which the first and second busbars face each other is orthogonal or substantially orthogonal to the acoustic wave propagation direction. Thus, the inter-electrode direction in each division resonator is orthogonal or substantially orthogonal to the acoustic wave propagation direction of the division resonator. In the present example embodiment, the inter-electrode directions of all division resonators are parallel or substantially parallel.

In the first division resonator 32A illustrated in FIG. 8, the region where adjacent first electrode finger 48A and second electrode finger 49A overlap when viewed in the acoustic wave propagation direction is an intersecting region. Similarly, each of the other division resonators also includes an intersecting region. In the present example embodiment, the excitation region of the division resonator is the intersecting region.

As in the first example embodiment, the first division resonator 32A and the fourth division resonator each have the forward direction relationship. The second division resonator and the third division resonator each have the opposite direction relationship. In the present example embodiment, among the plurality of division resonators, the number of division resonators having the forward direction relationship is equal to the number of division resonators having the opposite direction relationship. Thus, the electric power handling capability and the IMD characteristics can be effectively improved.

In the first to fourth example embodiments described above, the support 4 includes a cavity, as illustrated in FIG. 4. The cavity overlaps the excitation region of each division resonator in plan view. However, the support 4 may include an acoustic reflection film. Such an example is described below.

Figure 9:
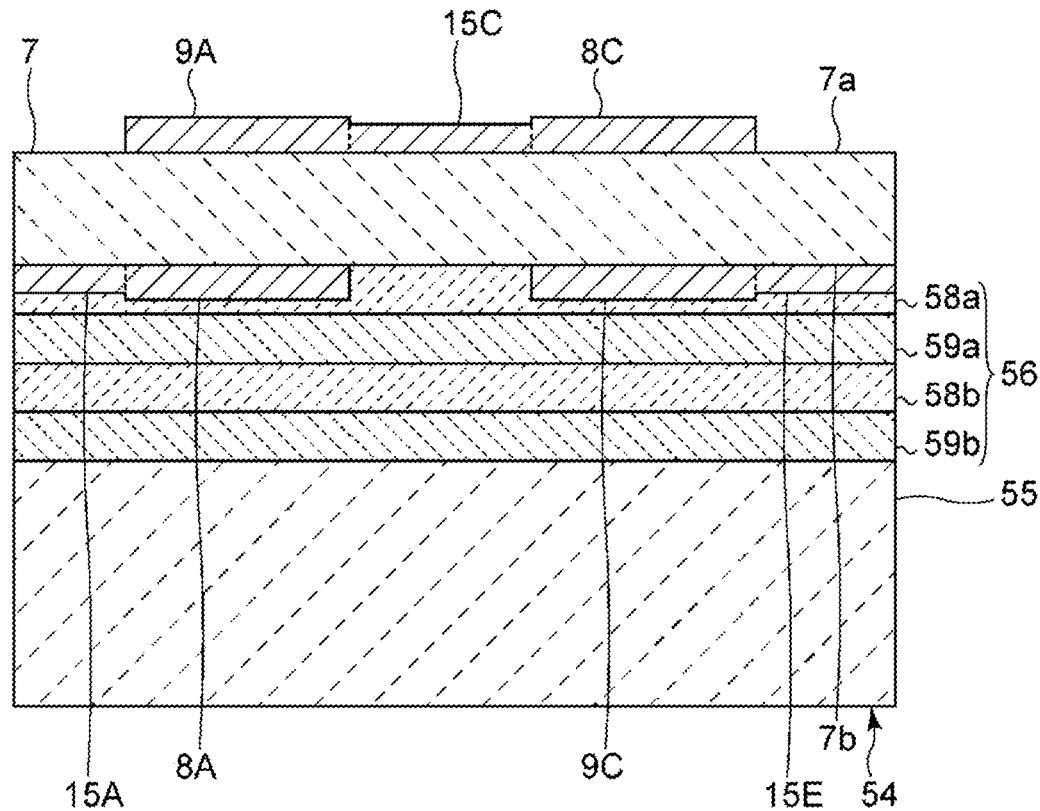
FIG. 9 is a schematic sectional view of a filter element according to a fifth example embodiment of the present invention, illustrating a portion corresponding to the cross-section illustrated in FIG. 4.

FIG. 9 is a schematic sectional view of a filter element of a fifth example embodiment of the present invention, illustrating a portion corresponding to the cross-section illustrated in FIG. 4.

The present example embodiment differs from the first example embodiment in that a support 54 includes an acoustic reflection film 56 and the support 54 does not include a cavity. More specifically, the acoustic reflection film 56 is provided on a support substrate 55. A piezoelectric layer 7 is provided on the acoustic reflection film 56. Except for the above-described differences, the filter element of the present example embodiment has the same or substantially the same configuration as the filter element 1 of the first example embodiment. In the present example embodiment, respective division resonators share the acoustic reflection film 56. The acoustic reflection film 56 overlaps the excitation region of each division resonator in plan view.

The acoustic reflection film 56 is a multilayer body including a plurality of acoustic impedance layers. More specifically, the acoustic reflection film 56 includes a plurality of low acoustic impedance layers and a plurality of high acoustic impedance layers. The low acoustic impedance layer is a layer with relatively low acoustic impedance. The plurality of low acoustic impedance layers of the acoustic reflection film 56 are a low acoustic impedance layer 58a and a low acoustic impedance layer 58b. On the other hand, the high acoustic impedance layer is a layer with relatively high acoustic impedance. The plurality of high acoustic impedance layers of the acoustic reflection film 56 are a high acoustic impedance layer 59a and a high acoustic impedance layer 59b. The low acoustic impedance layers and the high acoustic impedance layers are alternately stacked. The low acoustic impedance layer 58a is the layer closest to the piezoelectric layer 7 in the acoustic reflection film 56.

The acoustic reflection film 56 includes two low acoustic impedance layers and two high acoustic impedance layers, for example. However, the acoustic reflection film 56 may include at least one low acoustic impedance layer and at least one high acoustic impedance layer.

Examples of the material that can be used as the material of the low acoustic impedance layer include silicon oxide, aluminum and the like. Examples of the material that can be used as the material of the high acoustic impedance layer include a metal such as platinum, tungsten and the like, or a dielectric such as aluminum nitride, silicon nitride and the like.

In the present example embodiment, as in the first example embodiment, among the plurality of division resonators, the number of division resonators having the forward direction relationship is equal to the number of division resonators having the opposite direction relationship. Thus, the electric power handling capability and the IMD characteristics can be effectively improved.

The support 54 as provided in the present example embodiment may also be provided in the case where each division resonator is, for example, a SAW element as in the fourth example embodiment.

As described above, filter elements according to example embodiments of the present invention may be used in a filter device. Such an example is described below.

Figure 10:
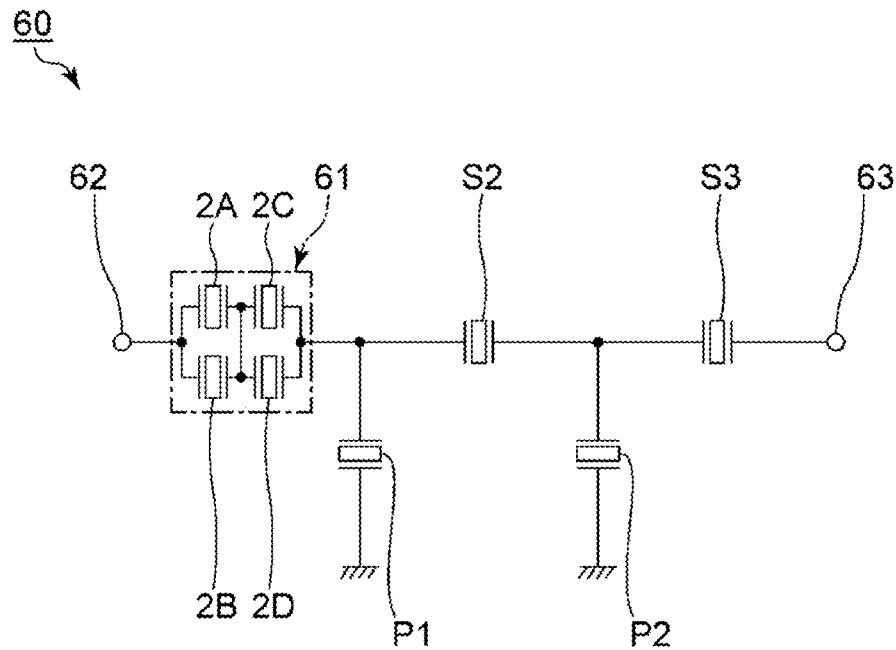
FIG. 10 is a circuit diagram of a filter device according to a sixth example embodiment of the present invention.

FIG. 10 is a circuit diagram of a filter device according to a sixth example embodiment of the present invention.

A filter device 60 is, for example, a ladder filter. In the filter device 60, resonators are provided in a series arm and parallel arms. More specifically, the filter device 60 includes a filter element 61, a series arm resonator S2, a series arm resonator S3, a parallel arm resonator P1 and a parallel arm resonator P2. The filter element 61 is a filter element according to an example embodiment of the present invention. The filter element 61 is a single resonator. In the present example embodiment, the filter element 61 has the same or substantially the same configuration as the filter element 1 of the first example embodiment. However, the filter element 61 may have the same or substantially the same configuration as other example embodiments.

The plurality of resonators in the filter device 60 are all acoustic wave resonators. More specifically, the plurality of resonators are, for example, BAW elements. However, the plurality of resonators may include, for example, a SAW element.

Furthermore, the filter device 60 includes an input terminal 62 and an output terminal 63. For example, the input terminal 62 and the output terminal 63 may be configured as electrode pads or as wiring.

As illustrated in FIG. 10, the filter element 61, the series arm resonator S2, and the series arm resonator S3 are connected in series with each other in the series arm connecting the input terminal 62 and the output terminal 63. Among the plurality of resonators, the filter element 61 is provided closest to the input terminal 62 side. In the filter element 61, among a plurality of division resonators, a first division resonator 2A and a second division resonator 2B are disposed closest to the input terminal 62 side.

In the filter device 60, the two parallel arms connect the series arm and a ground potential. The parallel arm resonator P1 is provided in one parallel arm. The parallel arm resonator P2 is provided in the other parallel arm. More specifically, the parallel arm resonator P1 is connected between the ground potential and a node between the filter element 61 and the series arm resonator S2. The parallel arm resonator P2 is connected between the ground potential and a node between the series arm resonator S2 and the series arm resonator S3.

The circuit configuration of the filter device 60 is not limited to the above as long as the resonators are provided in both of the series arm and the parallel arms of the filter device 60. At least one of the plurality of resonators is preferably a filter element according to an example embodiment of the present invention. Furthermore, the filter device according to the present embodiment is not limited to a ladder filter. For example, in the filter device, a ladder circuit section may be connected to a longitudinally coupled resonator acoustic wave filter. The resonators are preferably provided in both the series arm and the parallel arm of the ladder circuit section, and the plurality of resonators of the ladder circuit section preferably include a filter element according to an example embodiment of the present invention.

In the present example embodiment, the filter element 61 having the same or substantially the same configuration as in the first example embodiment is included. Thus, the electric power handling capability and the IMD characteristics of the resonators in the filter device 60 can be effectively improved.

It is preferable that among the plurality of resonators, the filter element 61 is closest to the input terminal 62 side. In such a case, the greatest power is applied to the filter element 61 among the plurality of resonators. As described above, the filter element 61 has high electric power handling capability. Thus, even if a large amount of power is applied to the filter element 61, the filter element 61 is less likely to be damaged. The resonators other than the filter element 61 can be located outside of the region where the greatest power is applied. Thus, in the filter device 60, the resonators other than the filter element 61 can also be less likely to be damaged.

Figure 11:
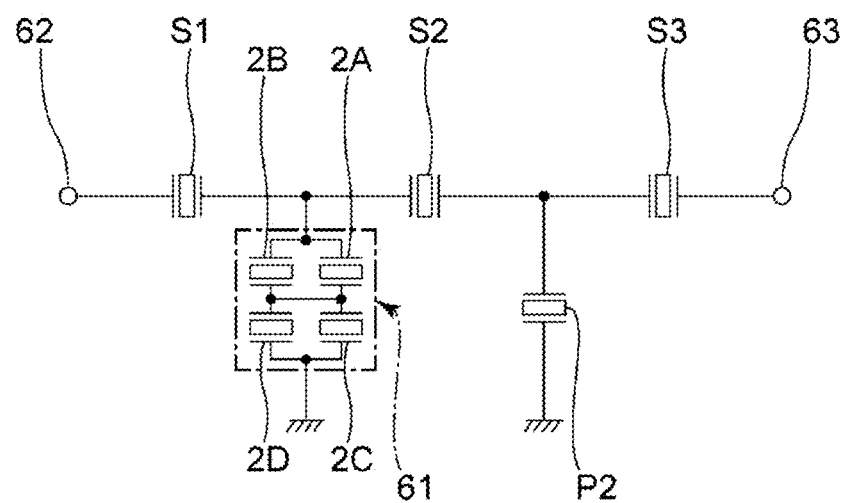
FIG. 11 is a circuit diagram of a filter device according to a modification of the sixth example embodiment of the present invention.

In the present example embodiment, the filter element 61 is provided in the series arm. However, the filter element 61 does not have to be provided in the series arm. In a modification of the sixth example embodiment illustrated in FIG. 11, a filter element 61 is provided in a parallel arm. Specifically, a series arm resonator S1, a series arm resonator S2, and a series arm resonator S3 are connected in series with each other between an input terminal 62 and an output terminal 63. The configuration of a parallel arm resonator P2 is the same or substantially the same as in the sixth example embodiment. On the other hand, the filter element 61 is provided in place of the parallel arm resonator P1. More specifically, the filter element 61 is connected between a ground potential and a node between the series arm resonator S1 and the series arm resonator S2. In the filter element 61, among the plurality of division resonators, a first division resonator 2A and a second division resonator 2B are provided closest to the input terminal 62 side.

In the present modification, the electric power handling capability and the IMD characteristics of the resonator in the filter device can also be effectively improved.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter element comprising:
   a piezoelectric layer with a polarization axis direction; and
   a plurality of division resonators including at least four division resonators provided at the piezoelectric layer and defined by an acoustic wave resonator divided in series and in parallel; wherein
   each of the plurality of division resonators includes a functional electrode on the piezoelectric layer, each of the functional electrodes includes a high-potential electrode with a relatively high potential and a low-potential electrode with a relatively low potential;
   when a direction parallel or substantially parallel to a direction in which the high-potential electrode and the low-potential electrode face each other and oriented from the high-potential electrode toward the low-potential electrode is defined as an inter-electrode direction, and when a relationship in which a component of the polarization axis direction parallel or substantially parallel to the inter-electrode direction and the inter-electrode direction are in a same direction is defined as a forward direction relationship and a relationship in which the component of the polarization axis direction parallel or substantially parallel to the inter-electrode direction and the inter-electrode direction are in opposite directions is defined as an opposite direction relationship, a number of division resonators with the forward direction relationship is equal to a number of division resonators with the opposite direction relationship among the plurality of division resonators; and
   the plurality of division resonators include a first pair of resonators connected in parallel and a second pair of resonators connected in parallel, and the first pair of resonators and the second pair of resonators are connected in series.

2. The filter element according to claim 1, wherein
   the plurality of division resonators are each defined as different stages based on an order of connecting the division resonators from a high potential side; and
   among the plurality of division resonators, a number of division resonators in a same stage is two, and among the two division resonators in the same stage, one has the forward direction relationship and another has the opposite direction relationship.

3. The filter element according to claim 2, wherein
   the plurality of division resonators each include an excitation region where an acoustic wave is excited; and
   areas of the excitation regions of the two division resonators in the same stage are equal or substantially equal to each other.

4. The filter element according to claim 1, wherein the plurality of division resonators include a first division resonator and a second division resonator connected in common to a same potential, and a third division resonator and a fourth division resonator connected in common to both of the first division resonator and the second division resonator.

5. The filter element according to claim 4, wherein the plurality of division resonators include a fifth division resonator connected to at least the third division resonator, and a sixth division resonator connected to at least the fourth division resonator.

6. The filter element according to claim 1, wherein the plurality of division resonators include a first division resonator and a second division resonator connected in common to a same potential, a third division resonator connected in series with the first division resonator, and a fourth division resonator connected in series with the second division resonator.

7. The filter element according to claim 1, wherein, in each of the plurality of division resonators, the high-potential electrode and the low-potential electrode face each other with the piezoelectric layer interposed therebetween.

8. The filter element according to claim 1, wherein
   the functional electrode of each of the plurality of division resonators is an IDT electrode; and
   each of the IDT electrodes includes the high-potential electrode and the low-potential electrode, each of the high-potential electrodes includes a first busbar and each of the low-potential electrodes includes a second busbar, and the inter-electrode direction is parallel or substantially parallel to a direction in which the first busbar and the second busbar face each other and is oriented from the first busbar toward the second busbar.

9. The filter element according to claim 1, wherein the piezoelectric layer is a lithium tantalate layer or a lithium niobate layer.

10. A ladder filter comprising:
    a plurality of resonators in a series arm and a parallel arm; wherein
    the filter element according to claim 1 is provided in the series arm.

11. The ladder filter according to claim 10, wherein
    the plurality of division resonators are each defined as different stages based on an order of connecting the division resonators from a high potential side; and
    among the plurality of division resonators, a number of division resonators in a same stage is two, and among the two division resonators in the same stage, one has the forward direction relationship and another has the opposite direction relationship.

12. The ladder filter according to claim 11, wherein
    the plurality of division resonators each include an excitation region where an acoustic wave is excited; and
    areas of the excitation regions of the two division resonators in the same stage are equal or substantially equal to each other.

13. The ladder filter according to claim 10, wherein the plurality of division resonators include a first division resonator and a second division resonator connected in common to a same potential, and a third division resonator and a fourth division resonator connected in common to both of the first division resonator and the second division resonator.

14. The ladder filter according to claim 13, wherein the plurality of division resonators include a fifth division resonator connected to at least the third division resonator, and a sixth division resonator connected to at least the fourth division resonator.

15. The ladder filter according to claim 10, wherein the plurality of division resonators include a first division resonator and a second division resonator connected in common to a same potential, a third division resonator connected in series with the first division resonator, and a fourth division resonator connected in series with the second division resonator.

16. A ladder filter comprising:
a plurality of resonators in a series arm and a parallel arm; wherein
the filter element according to claim 1 is provided in the parallel arm.

17. The ladder filter according to claim 16, wherein
the plurality of division resonators are each defined as different stages based on an order of connecting the division resonators from a high potential side; and
among the plurality of division resonators, a number of division resonators in a same stage is two, and among the two division resonators in the same stage, one has the forward direction relationship and another has the opposite direction relationship.

18. The ladder filter according to claim 17, wherein
the plurality of division resonators each include an excitation region where an acoustic wave is excited; and
areas of the excitation regions of the two division resonators in the same stage are equal or substantially equal to each other.

19. The ladder filter according to claim 16, wherein the plurality of division resonators include a first division resonator and a second division resonator connected in common to a same potential, and a third division resonator and a fourth division resonator connected in common to both of the first division resonator and the second division resonator.

20. The ladder filter according to claim 16, wherein the plurality of division resonators include a first division resonator and a second division resonator connected in common to a same potential, a third division resonator connected in series with the first division resonator, and a fourth division resonator connected in series with the second division resonator.

\* \* \* \* \*